(12) United States Patent
Schina et al.

(10) Patent No.: US 11,225,080 B2
(45) Date of Patent: Jan. 18, 2022

(54) METHOD FOR FORMING THERMAL INKJET PRINTHEAD, THERMAL INKJET PRINTHEAD, AND SEMICONDUCTOR WAFER

(71) Applicant: SICPA HOLDING SA, Prilly (CH)

(72) Inventors: Paolo Schina, Turin (IT); Silvia Baldi, Samone (IT); Irma Disegna, Ivrea (IT); Miriam Perini, Ivrea (IT)

(73) Assignee: SICPA HOLDING SA, Prilly (CH)

( * ) Notice: Subject to any disclaimer, the term of this patent is extended or adjusted under 35 U.S.C. 154(b) by 209 days.

(21) Appl. No.: 16/333,194

(22) PCT Filed: Oct. 19, 2016

(86) PCT No.: PCT/EP2016/075108
§ 371 (c)(1),
(2) Date: Mar. 13, 2019

(87) PCT Pub. No.: WO2018/072822
PCT Pub. Date: Apr. 26, 2018

(65) Prior Publication Data
US 2019/0240980 A1 Aug. 8, 2019

(51) Int. Cl.
*B41J 2/16* (2006.01)
*H01L 21/311* (2006.01)
(Continued)

(52) U.S. Cl.
CPC ......... *B41J 2/1626* (2013.01); *B41J 2/14088* (2013.01); *B41J 2/14129* (2013.01);
(Continued)

(58) Field of Classification Search
CPC .............. H01L 21/31111; H01L 27/092; B41J 2/14088; B41J 2/1601
See application file for complete search history.

(56) References Cited

U.S. PATENT DOCUMENTS 4,719,477 A * 1/1988 Hess .................... B41J 2/14129
29/592.1
5,045,870 A 9/1991 Lamey et al.
(Continued)

FOREIGN PATENT DOCUMENTS

AU 2005337424 11/2010
CN 1403280 3/2003
(Continued)

OTHER PUBLICATIONS

Chinese Office Action in counterpart Chinese Application No. 201680090270.3 dated Apr. 29, 2020 (and English language translation of the Office Action).
(Continued)

Primary Examiner — Galina G Yushina
(74) Attorney, Agent, or Firm — Muncy, Geissler, Olds & Lowe, P.C.

(57) ABSTRACT

The present invention provides a method for forming a thermal inkjet printhead, comprising at least the following steps: providing a semiconductor wafer including an integrated electronic circuit and a section for forming a thermal actuator element, the integrated circuit comprising at least: a thermal insulating layer formed over a substrate; and a first metal layer formed over the thermal insulating layer; wherein the first metal layer extends into the section for forming the thermal actuator element; and etching a section for forming a thermal actuator element to the first metal layer such that the first metal layer is acting as an etch stop layer. Further there is provided a thermal inkjet printhead formed by a method of the present invention and a semiconductor wafer for forming the thermal inkjet printheads by a method of the present invention.

5 Claims, 11 Drawing Sheets

(51) Int. Cl.
  *B41J 2/14* (2006.01)
  *H01L 27/092* (2006.01)
(52) U.S. Cl.
  CPC ....... *B41J 2/1601* (2013.01); *H01L 21/31111* (2013.01); *H01L 27/092* (2013.01); *B41J 2202/13* (2013.01)

(56) References Cited

U.S. PATENT DOCUMENTS

| | | | |
|---|---|---|---|
| 5,844,586 A * | 12/1998 | Berry | B41J 2/1603 347/59 |
| 6,309,053 B1 | 10/2001 | Torgerson et al. | |
| 2005/0162474 A1 | 7/2005 | Han | |
| 2005/0168534 A1 | 8/2005 | Beak | |
| 2007/0026548 A1 | 2/2007 | Dodd et al. | |
| 2010/0320608 A1 | 12/2010 | Burton et al. | |
| 2014/0118441 A1 * | 5/2014 | Lambright | B41J 2/1629 347/40 |
| 2015/0114927 A1 | 4/2015 | Yang et al. | |
| 2016/0159091 A1 | 6/2016 | Nystrom et al. | |

FOREIGN PATENT DOCUMENTS

| | | |
|---|---|---|
| CN | 1421316 | 6/2003 |
| CN | 1444523 | 9/2003 |
| CN | 1669797 | 9/2005 |
| CN | 101031426 | 9/2007 |
| CN | 101287605 | 10/2008 |
| CN | 101960565 | 1/2011 |
| CN | 105667087 | 6/2016 |
| JP | 07314684 | 12/1995 |
| JP | 2004243542 | 9/2004 |
| JP | 2014213575 | 11/2014 |

OTHER PUBLICATIONS

Japanese Office Action in counterpart Japanese Application No. 2019-511660 dated Jul. 7, 2020 (along with the English language translation of the Office Action).
International Search Report and Written Opinion issued with respect to application No. PCT/EP2016/075108.
International Preliminary Report on Patentability issued with respect to application No. PCT/EP2016/075108.

* cited by examiner

METHOD FOR FORMING THERMAL INKJET PRINTHEAD, THERMAL INKJET PRINTHEAD, AND SEMICONDUCTOR WAFER

TECHNICAL FIELD

The present invention relates to a thermal inkjet printhead. Specifically, the present invention relates to a method for forming a thermal inkjet printhead, wherein a semiconductor wafer including an integrated circuit and a section for forming a thermal actuator element is prefabricated and subsequently the thermal actuator element is formed, i.e. integrated, on the prefabricated semiconductor wafer. The present invention also relates to a semiconductor wafer used in the method of forming a thermal inkjet printhead.

BACKGROUND

A thermal inkjet printhead may schematically be described as an electronic circuit including both logical and power circuitry electrically connected to fluidic thermal actuators. The fluidic thermal actuators may form or be part of a Micro-Electro-Mechanical System (MEMS) and may require the use of special materials, for both metal and dielectric layers, commonly not adopted in standard integrated circuits.

However, heavy investment may be necessary to set up silicon foundries capable to carry out complete manufacturing processes for high integration printhead actuators. However, when small volumes of production are involved, as for instance in industrial printing, the high level of investment may stop manufacturers from relying on the most advanced semiconductor technology necessary to have high level of performances, resulting in maintaining obsolete or outdated technologies.

FIG. 1 shows a top view of a thermal ink printhead. As shown in FIG. 1, a thermal ink jet printhead includes a substrate 1 where on its surface a plurality of heaters 2 is arranged in one or more columns 3, forming a chip. Often, the columns are placed in close proximity of a feedthrough-slot 4 made in an internal section of the chip to allow ink refilling.

FIG. 2 shows a top view of a silicon wafer thermal printheads are manufactured in to be subsequently diced in single chips.

Presently, thermal printheads as shown in FIG. 2 are manufactured in an specifically designed wafer 5 such as a silicon wafer, subsequently diced in single chips, using semiconductor technology, including for instance thin film deposition, photolithography, wet and dry etching techniques, ion implantation, oxidation, etc.

The heaters 2 may be made of a resistive film, contacted with suitable conducting trails; in the peripheral region of the chip, there may be a set of contact pads 6 which are bonded to a flexible printed circuit, normally using a TAB (Tape Automated Bonding) process.

With reference to FIG. 3, the flexible circuit 7 may be attached to a printhead cartridge body 8 and may include contact pads 9 to exchange electrical signals with the printer. As the number of the heaters increases, the complexity of the electronic layout may increase as well. Thus, there may be in the active part 10 of the substrate 1 arrays of MOS transistors 11 for instance for addressing resistors, logic circuits 12, programmable memories 13 and other devices.

As illustrated in FIG. 4 and FIG. 5, onto a chip surface, where a stack of resistive, conductive and dielectric films have been previously deposited and patterned, that is schematically represented as a region 14, and may be realizing a microfluidic circuit. As a result the ink may flow in the deposited microfluidic circuit through suitable channels 15 and arrive in an ejection chamber 16, walls of which may be surrounded by a heating resistor 2, e.g. the heating resistor 2 may be on a floor of the ejection chamber. The microfluidic circuit may be patterned in a suitable polymeric layer 17 that may be referred to as barrier layer. A nozzles plate 18 may be assembled above the barrier layer which may house a plurality of nozzles 19, aligned with the underlying heating resistors, from which the ink droplets 20 may be ejected. In fact, a short current pulse may heat the resistor 2, which in turn may cause vaporizing of a thin layer of ink just above it and forming of a vapor bubble 21. The pressure in the vaporized layer may increase suddenly, causing the ejection of part of the overlying liquid from the nozzle. The ink drop may travel towards the medium, producing an ink dot on its surface. After that, new ink may be recalled into the chamber, to replace the ejected drop, until for instance a steady state is reached.

In order to optimize the energy transfer from the resistor 2, for instance heated by the current pulse through the Joule effect, to the ink it may be necessary that the resistor is thermally insulated from the substrate, so that the heat flow takes place preferably towards the overlying ink, which may in turn be separated from the resistive layer by a thin dielectric film, to avoid electrical leakages.

Since the substrate is made of silicon, which has an appreciable thermal conductivity, it may be necessary to interpose an insulating layer with a sufficient thickness between the substrate and the resistor. In other words, the resistor may have to be deposited over a suitable insulating layer grown or deposited onto the substrate.

Thermally grown silicon oxide and Boron Phosphorus Silicon Glass (BPSG), produced for instance with high-temperature processes, may be both suitable materials for the thermal insulation of the resistor, used alone or in combination.

Since the temperature of growth or deposition and/or annealing of these materials may be higher than heater operating temperature in the printhead, these will remain stable during the normal operation of the device.

The resistive film, which undergoes rapid and large temperature changes during the work, may have stable properties and a good resistance to thermo-mechanical stress. Typically, a resistance value of a heater may for instance be several tens of Ohms. For instance a square-shaped heater with a resistance of about 30 Ohms may be typically adopted, even if different shapes and different resistance values may be used, whilst two longitudinal resistive stripes connected by a transversal conductive metal band, i.e. U-shaped resistor, would produce with the same footprint a resistance about four times higher, e.g. about 120 Ohm.

A widespread and long-lasting choice for the resistor may be a composite film made of Tantalum and Aluminum: a film thickness of about 900 Angstrom may give a sheet resistance of 30 Ohms-per-square, i.e. a square-shaped resistor made with such a film has a resistance of 30 Ohms.

The dielectric layer above the resistor, which provides the electrical insulation to the ink, may be thin enough to allow a strong heat flow but also may endure the thermo-mechanical stresses experienced during the work and the shocks due to bubble collapse. Generally, a silicon nitride film, alone or in combination with silicon carbide, may be used for this purpose. Nevertheless, often the thin dielectric layer may not be sufficiently strong and an additional protective film, also referred to as cavitation layer, made of a refractive metal, like Tantalum, may be deposited above the dielectric material.

To address and drive the plurality of heaters some techniques are known in the prior art. If the number of the nozzles is low, up to several tens, each resistor can be connected directly through an electrical track to the respective contact pad, whilst the return of current can be commonly collected by one or few ground pads.

As the number of nozzles increases, the direct individual driving may be difficult to realize, due to the high number of contact pads necessary for addressing the resistors. In fact, the pads may be distributed along the outer border of the chip and their number may not rise without any limit.

A more practical solution is adopting an addressing matrix, which allows driving a large number of resistors using a reduced number of contact pads. The addressing matrix may preferably be realized with a plurality of Metal Oxide Semiconductor (MOS) transistors, each of them may be in electrical communication with a determined resistor. Connecting in a suitable way the electrodes of the transistor matrix, the individual heaters can be activated on demand, causing the ejection of the ink droplets from the printhead.

The fabrication of the transistor matrix may preferably be in a silicon substrate, using the standard processes adopted in the semiconductor technology, e.g. photolithographic techniques, silicon oxidation, film deposition, dry and wet chemical etching and other techniques well known to those skilled in the art may be applied to manufacture the device.

Moreover, a logical circuitry can be implemented on the silicon substrate, increasing the complexity and the performance of the device. Also the logical circuitry may preferably be realized by means of MOS transistors, like a addressing matrix. However, the characteristics of the driving MOS elements are generally different from the ones of the logical MOS elements. The driving MOS elements may be able to sustain a high power peak during to the current pulse, whilst the logical MOS elements may not need to bear high power, but rather these may be able to switch rapidly between the different states, to perform operations at a high rate.

Although only n-type MOS (NMOS) transistors may be adopted, the logical circuitry may preferably be realized using complimentary MOS (CMOS) technology, e.g. complimentary re-channel and p-channel MOS transistors may be realized in the same substrate, providing logical gates with low power consumption and fast commutation rate, especially when a high integration level may be desired.

The condition of a high integration level may require high resolution photolithography, to produce a gate length in the sub-micrometric range, which may be the minimum size of the circuit features, also referred to technology node. The complexity of a high integration device may often involve a plurality of metallization levels or layers as well as dielectric and planarization layers.

In FIG. 6 the cross sectional view of a classical NMOS printhead is illustrated. The surface of the silicon substrate 1 may be thermally oxidized to grow the field oxide (FOX). The field oxide 22 is intended for insulating adjacent devices and as a part of the thermal insulating layer below the heaters.

Openings in the field oxide may be left for the substrate doping of the active regions. A thin gate oxide 23 may be grown in the field oxide free region and the polysilicon gate 24 may be placed onto the gate oxide in the MOS channel region. Suitable n+ diffusions 25 may be carried out in the substrate, providing either the source or the drain region of the MOS transistor. Optionally a p+ diffusion 26 can be made for realizing a ground contact in the substrate (not shown).

Subsequently, the whole surface may be covered with a boron phosphorus silicon glass (BPSG) film 27, which may form a second part of the thermal insulating layer below the heaters and may provide electrical insulation for an overlaying aluminum metal track. The BPSG film 27 may provide as well a partial planarization and smoothing of the surface. Contacts may be opened in the BPSG film where metal tracks may contact electrically the source or drain diffusions or the polysilicon.

The metal tracks can be realized with a double layer. At first, a thin film of Ta—Al 28 may be deposited over the BPSG film 27 and also in a diffusion contact region 30; a Ta—Al film may guarantee a good interface with the doped silicon region, preventing the aluminum spiking into the substrate, which would cause electrical issues.

Due to the intrinsic resistivity and the reduced thickness (e.g. about 900 Angstrom) of the Ta—Al film, e.g. Ta, TaAl or TaAl+Al, it may be adopted as a resistive film for the heaters of the printhead. Therefore, the Ta—Al layer may have the double function of resistive film and of barrier layer, avoiding the need of a further layer between the Al metal and the doped silicon. The second layer of the metal tracks may be made of aluminum, which can contain small amount of copper, silicon or a combination of these. An aluminum film 29 may be deposited just above the Ta—Al film having a higher thickness.

Where both the films are present, the electrical conductivity of the aluminum may dominate, realizing a conductive, i.e. low resistance, path for the electrical current. In the region of the heater 2 the aluminum layer may be removed and the sole Ta—Al layer may remain, providing a resistive path for the current causing the heating necessary for the drop ejection.

The aluminum layer may be covered with a suitable dielectric film 31. This film may for instance include two layers: a silicon nitride layer, which may guarantee the good electrical insulation, and a silicon carbide layer, resistant to wear and chemical agents. These materials may be suitable for the use in a thermal ink jet printhead, due to their high stability at high temperature. On the other hand, they provide poor step coverage when the underlying surface profile changes abruptly, e.g. crossing the metallization.

An additional tantalum layer 32 may be deposited in the heater region above the dielectric film 31, to protect the films against the mechanical shock due to for instance bubble collapse. This may also provide a good adhesion with the overlying barrier layer, in which the fluidic circuit is realized, preventing the ink penetration at the interface between the two materials.

Moreover, the tantalum layer turns out to be also effective to improve the adhesion of a final Au layer 33, used as a second metal layer for the general power supply and ground bus. In this case, a double layer Ta+Au may be deposited and patterned. The first one may provide a good adhesion to the underlying dielectric 31 and performs a suitable contact with the aluminum in the contact region 34, whilst the second one may guarantee a good conductivity, necessary for carrying the high current coming from the plurality of the heaters.

The structure of the described NMOS print-head may be cost effective, because of the very simple NMOS process, which requires a reduced number of masks, allowing the use of many layers (thermal barrier oxides, metals, dielectrics) with different purposes in the MOS and in the MEMS parts of the print-head.

The cross section view of a standard, state-of-the-art CMOS integrated circuit is depicted in FIG. 7. Since a CMOS device may include complementary p-channel and n-channel MOS transistors, at least one doped well may be implanted in the substrate. For instance a n-well 35 may be implanted in the region where the p-channel MOS transistors will be formed.

As previously, onto the substrate 1 the field oxide 22 (FOX) and the thin gate oxide 23 may be grown and the polysilicon gate 24 may be deposited above the gate oxide in the MOS channel regions. Suitable n+ diffusions 25 may be carried out in the substrate, whilst the p+ diffusions 26 may be carried out in the previously implanted n-well 35, in order to realize the n-channel MOS transistors (NMOS) and the p-channel MOS transistors (PMOS), respectively. Many other diffusions, both p and n, like p-well, p or n channel-stop, p or n LDD, threshold voltage adjust etc. may be performed to optimize the device performances or to obtain specific behaviors.

A dielectric and planarizing layer 36, also referred to as Inter Layer Dielectric (ILD) layer, may be deposited, to separate the polysilicon from the first metallization layer 37, also referred to as M1. The ILD layer 36 can be a doped silicon glass layer like a PSG or BPSG. Before depositing M1, openings may be formed in the ILD 36 layer to allow the contact between the source and the drain diffusions of the MOS transistors and the M1 layer 37. Another dielectric layer 40, also referred to as Inter Metal Dielectric (IMD1) layer, may be deposited to separate M1 from the overlying second metallization layer 38, also referred to as M2.

The IMD1 layer usually may be a multilayer film including Spin On Glass (SOG) or other layers suitable to planarize the surface morphology of M1. Before depositing M2, openings may be formed in the IMD1 layer 40 where the contacts between M1 and M2 have to be realized. A further dielectric layer 41, also referred to as Inter Metal Dielectric (IMD2), may be deposited to separate M2 from the upper third metallization level 39 (M3). Also IMD2 may be a multilayer film suitable to planarize M2 morphology.

Before depositing M3, openings may be formed in the IMD2 layer 41 where the contacts between M2 and M3 have to be realized. Finally, a first passivation layers 42 (PAS1) and a second passivation layer 43 (PAS2) may be deposited to protect the whole circuitry from external agents, like mechanical scratches, contaminants, moisture etc. Typically, the first passivation layer may be silicon oxide and the second passivation layer may be silicon nitride. Sometimes, only one passivation layer is used.

The CMOS device may turn out to be an integrated circuit. A plurality of metal layers, three or more, may be commonly adopted and many interposed dielectric layers may be necessary to insulate the different levels of metal tracks. A good planarity of the surface in all the phases of the process may be necessary to carry out correctly the deposition and the etching of the different layers and the photo-lithographic operations involved in the film patterning, mainly when high resolution circuit features have to be obtained.

Therefore, all the dielectric layers may provide step coverage, in order to smooth the surface morphology due to the film pattern. In the CMOS circuit depicted in FIG. 7 the Inter Layer Dielectric film 36, deposited onto the field oxide 22, may be similar to the BPSG layer 27 in FIG. 6 and just BPSG may be used to realize the ILD in CMOS devices.

As mentioned above, both the field oxide and the BPSG may be produced in processes carried out at high temperature, before the deposition of any metal layer. Therefore, these may maintain a good stability also when the device works at a temperature lower than the deposition or annealing temperature.

The Inter Metal Dielectric films IMD1 and IMD2 may have to be deposited in processes which are performed at low temperature, to prevent any damage of the metal layers already present. These may provide step coverage but do not remain thermally stable when the operating temperature increases beyond the deposition temperature.

In spite of their moderate deposition temperature, silicon nitride and silicon carbide in the dielectric film 31, adopted in the printhead device, described above in FIG. 6, may be stable even at temperatures as high as the operating heater temperature in a printhead.

Nevertheless, these cannot be used as IMD film in the CMOS device, due to the poor step coverage, mentioned above.

Similarly, the standard IMD layers in the CMOS device, which provide excellent step coverage, may not be suitable for the MEMS portion of a printhead, due to the poor thermal stability at the operating temperature of the print-head heater.

Another important difference between the standard printhead technology and the CMOS technology may lie in the nature of the metal films adopted in the respective applications. The composite resistive film made by tantalum and aluminum, which may be suitable to provide a resistive path for the current causing the heating necessary for the drop ejection, not normally be adopted in the CMOS technology.

The tantalum cavitation layer, which may be necessary in the printhead to protect the heaters against the mechanical shock caused by bubble collapse and, moreover, may improve the adhesion with the overlying films, may not be used in the standard CMOS process.

Finally, gold may be a contaminant in any fabrication or facility that uses CMOS processing due to its large diffusivity in silicon. Gold may behave as a recombination center and can affect the carrier lifetime and the device performance.

In conclusion, the CMOS process cannot be simply extended to the manufacturing of a thermal actuator part of a printhead, also referred to as micro-electromechanical system (MEMS) parts, due to the requirements of special materials and dedicated production lines.

SUMMARY

Therefore, there is the need to provide a method for forming a thermal inkjet printhead, a thermal inkjet printhead, and a related semiconductor wafer where a thermal actuator part of a printhead, also referred to as a fluidic thermal actuator or MEMS part, e.g. a micro-heater, may be realized in the specific facility, starting from a semi-manufactured or pre-fabricated wafer, where the logical and the power circuitry, i.e. integrated circuit (IC) part, have been previously realized, according to the standard semiconductor technology.

Another object of the present invention is to provide a semiconductor wafer from which a thermal inkjet printhead may be formed easily and cost-effective.

Yet another object of the present invention is to provide a thermal inkjet printhead and a method for forming where it is cost effective to produce the thermal inkjet printhead in relatively small numbers for instance for industrial applications.

The above mentioned objects and problems are solved by the subject matter of the independent claims. Further preferred embodiments are defined in the dependent claims.

According to one aspect of the present invention, there is provided a method for forming a thermal inkjet printhead, comprising at least the following steps providing a semiconductor wafer including an integrated electronic circuit and a section for forming a thermal actuator element, i.e. where the thermal actuator element has to be formed, may also be referred to as heater section, the integrated circuit comprising at least a thermal insulating layer formed over a substrate; and a first metal layer formed over the thermal insulating layer; wherein the first metal layer extends into the heater section; and etching a heater section for forming a thermal actuator element down to the first metal layer such that the first metal layer is acting as an etch stop layer.

According to another aspect of the present invention, there is provided a thermal inkjet printhead including an integrated electronic circuit and a section for forming a thermal actuator element, formed according to any one of the methods according to the present invention.

According to another aspect of the present invention, there is provided a semiconductor wafer including an integrated electronic circuit and a section for forming a thermal actuator element, the integrated circuit comprising at least a thermal insulating layer formed over a substrate; a first metal layer formed over the thermal insulating layer; this first metal layer is one of the metal layer used in the integrated circuit, wherein the first metal layer extends into the heater section such that the first metal layer is usable as a etch stop layer while forming the thermal actuator element.

BRIEF DESCRIPTION OF THE DRAWINGS

Embodiments of the present invention, which are presented for better understanding the inventive concepts and which are not to be seen as limiting the present invention, will now be described with reference to the figures.

DETAILED DESCRIPTION

Figure 1:
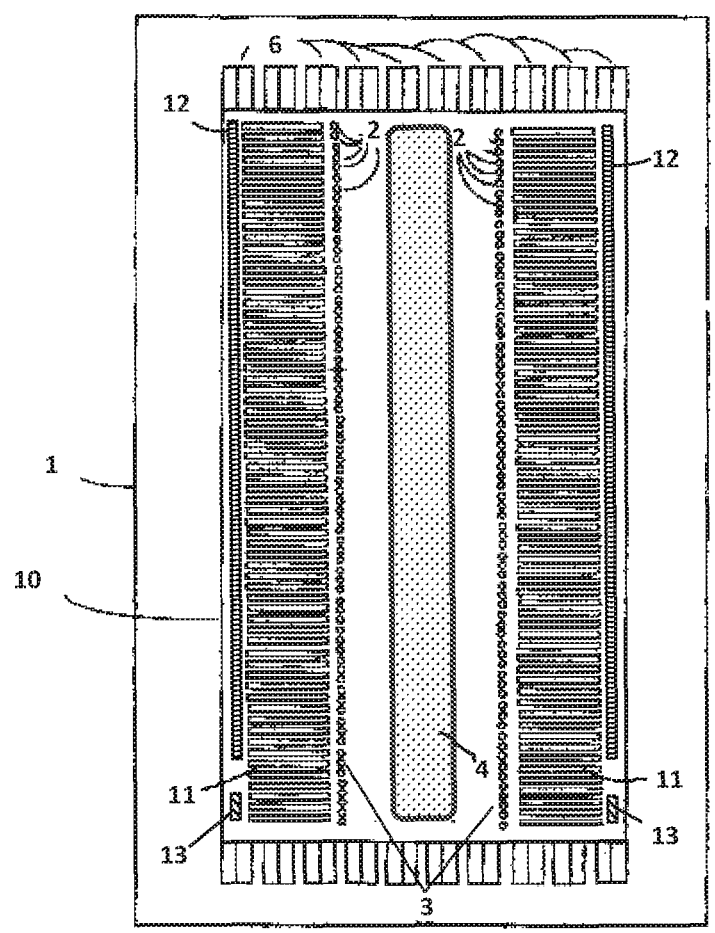
FIG. 1 shows a top view of a thermal ink printhead.
Figure 2:
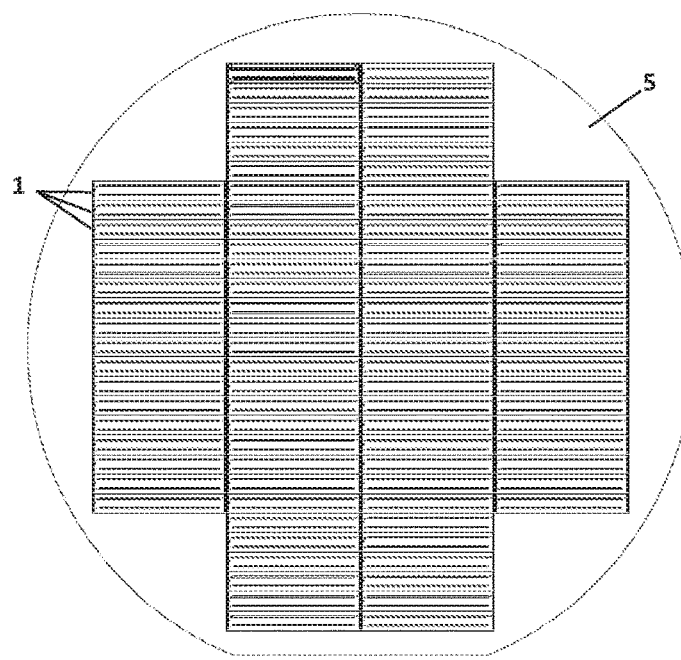
FIG. 2 shows a top view of silicon wafer thermal printheads are manufactured in to be subsequently diced in single chips.
Figure 3:
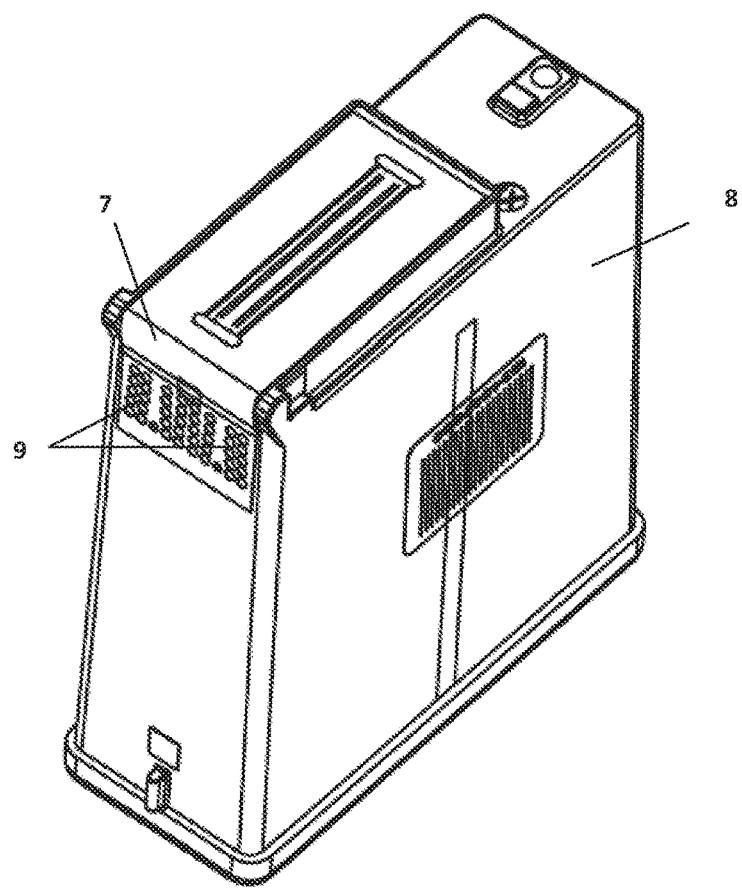
FIG. 3 shows a side view of a printhead cartridge body attached thereto a flexible circuit and including contact pads.
Figure 4:
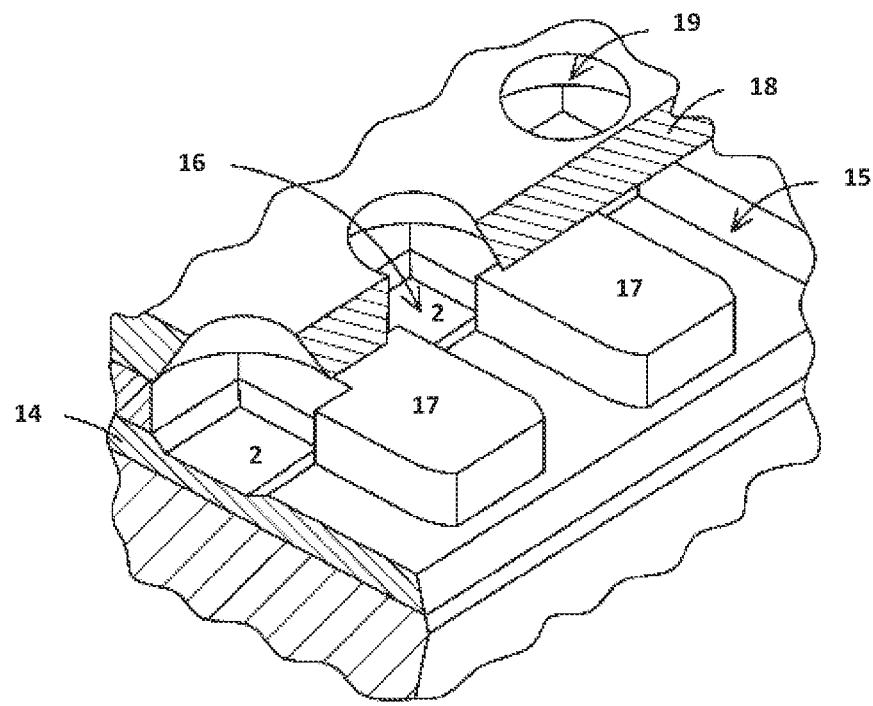
FIG. 4 shows a detailed view of a fluidic circuit and heater elements.
Figure 5:
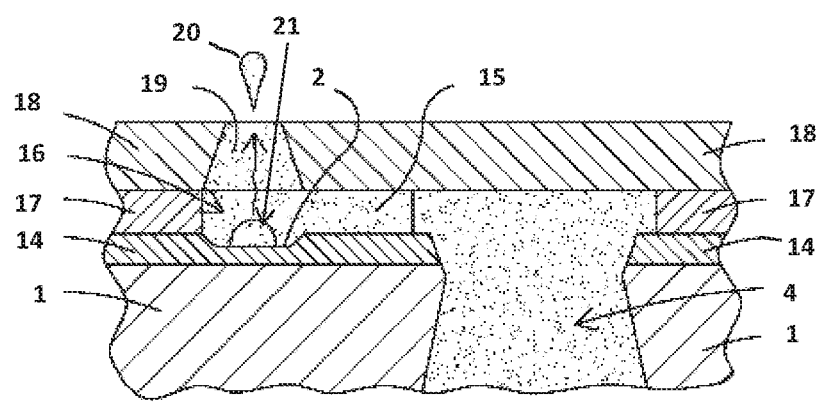
FIG. 5 shows a cross-sectional view of a printhead thermal actuator element.

A process to integrate an integrated circuit (IC) manufactured according to standard CMOS technology in a thermal ink jet printhead is described in the following according to at least one embodiment of the present invention.

According to one embodiment of the present invention the problems arising from matching of two manufacturing technologies are solved, providing a cost effective and efficient solution to produce or form high-performance printheads with low investment cost.

The invention according to one embodiment allows obtaining a complete fluidic actuator provided with a high-performance electronic circuitry, leveraging on technological commodities, without the need to invest heavily in a full custom process.

According to one embodiment of the present invention a method for forming a thermal inkjet printhead may comprise at least the following steps providing a semiconductor wafer including an integrated electronic circuit and a section for forming a thermal actuator element, the integrated circuit comprising at least a thermal insulating layer formed over a substrate; and a first metal layer formed over the thermal insulating layer; wherein the first metal layer extends into the section for forming the thermal actuator element, i.e. heater section, may also be referred to as the micro-electromechanical system, MEMS; and etching a section for forming a thermal actuator element down to the first metal layer such that the first metal layer is acting as an etch stop layer.

In other words the method according to the present invention for forming a thermal inkjet printhead, comprising at least the following steps providing a semiconductor wafer including an integrated electronic circuit and a section where the thermal actuator element, i.e. a heater section, is to be formed, the integrated circuit comprising at least a thermal insulating layer formed over a substrate; and a first metal layer formed over the thermal insulating layer; wherein the first metal layer extends into the heater section; and etching a heater section for forming a thermal actuator element down to the first metal layer such that the first metal layer is acting as an etch stop layer.

According to one embodiment a layer stack including a field oxide layer (FOX) and an inter-layer dielectric (ILD), such as a silicon glass doped with Boron and/or Phosphorus (BPSG or PSG), both layers belonging to the CMOS process, as a thermal insulating layer below the heater, may be used in a thermal actuator element, also referred to as micro-electromechanical system (MEMS), structure. The semi-manufactured layer may arrive from a CMOS foundry covered by dielectric layers used in the CMOS process, also in the MEMS region.

Since the etch selectivity between silicon glass (BPSG or PSG) and the inter-metal dielectric layers (IMD) may be very poor, an extension of a metal layer from the CMOS circuit may be used as an etch stop onto the BPSG layer during the MEMS forming process. The etch stop may be subsequently removed, leaving the thermal insulating layer unaffected in both thickness and uniformity, which may be important in the thermal energy transfer from the heater to the fluid.

A full custom process for a CMOS printhead may be anyhow set up, but heavy investment is needed, which may be justified only by high production volumes. Typically the production volumes of printheads intended for industrial applications, on the contrary, may hardly justify such an investment.

If an improvement of the performance of the printhead electric circuitry is pursued, a practical solution according to the present invention may be relying on the integration of a logic circuit portion made in a CMOS silicon foundry with a MEMS portion formed in a second foundry, which may be provided with the process capabilities involved with the special materials used in a printhead, but not requiring necessarily the high resolution equipment of a CMOS process.

The integration process, i.e. the building of the MEMS over the existing CMOS circuit on a silicon chip or wafer, may follow some constraints of both the CMOS and the MEMS structure. The CMOS constraints may be the layer materials and thicknesses: both are specific of the foundry process and, any substantial change can modify the devices parameters and performance; only small changes to the layer thicknesses may be allowed.

On the other hand, the MEMS structure, simply referred to as MEMS, may need specific layers, not present in the CMOS structure, nor polysilicon and metal films of the CMOS device may be suitable for the application in the thermal actuator element. Therefore, the MEMS area may be free of any electrically conductive layer belonging to the CMOS circuitry, except for a short track extending just beyond the MEMS area boundary, necessary to contact the heater circuit and the etch-stop layer, using the same conductive layer as will be described in the following.

According to one embodiment of the present invention it is provided a semiconductor wafer including an integrated electronic circuit and a section for forming a thermal actuator element, the integrated circuit comprising at least a thermal insulating layer formed over a substrate; a first metal layer formed over the thermal insulating layer; this first metal layer is one of the metal layer used in the integrated circuit, wherein the first metal layer extends into the section for forming the thermal actuator element, i.e. heater section, such that the first metal layer is usable as a etch stop layer while forming the thermal actuator element.

Figure 8:
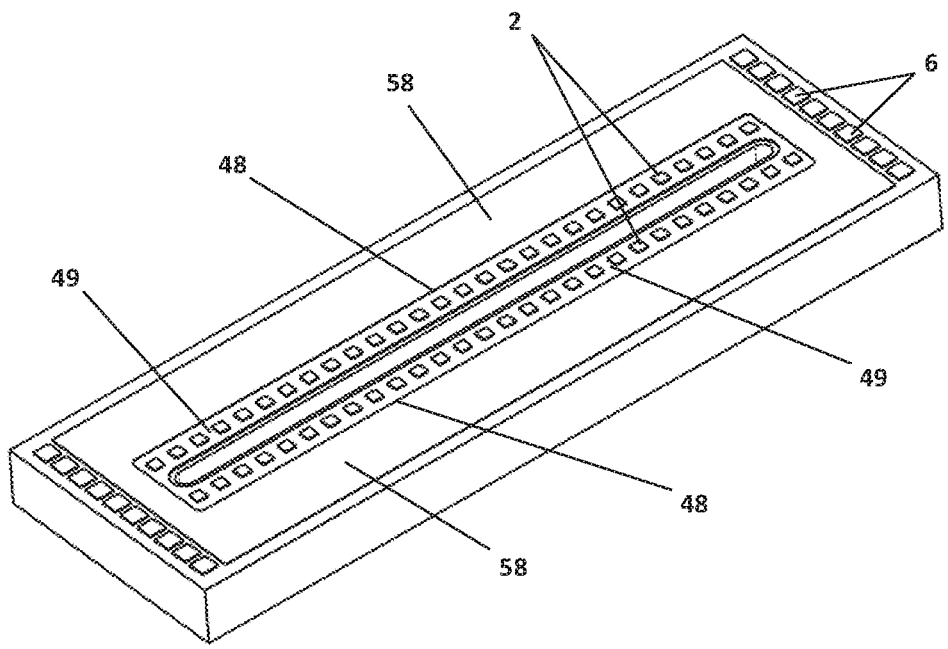
FIG. 8 shows a schematic chip layout showing the division between a CMOS logical circuit area and a MEMS area according to one embodiment of the present invention.

FIG. 8 illustrates a schematic chip layout, showing the division between a CMOS logical circuit area 58 and a MEMS area 49, enclosed within a boundary outline 48; the MEMS area may comprise a heater array 2 and an ink feeding slot. Note a printhead chip could comprise a plurality of separated MEMS regions, instead of a single one as illustrated in FIG. 8.

Since the two parts may have to be realized on the same silicon chip or wafer, it may be necessary to match the thickness of a basic layer, i.e. the silicon oxide immediately over the silicon substrate. The thermal barrier below the printhead heater may be stable up to 700-800° C. Therefore, only a thermally grown oxide or a reflowed silicon glass like PSG or BPSG, or a combination of the two materials may be suitable for this function.

These kind of oxides cannot be grown or deposited with the CMOS device already realized, due to the high temperature required, which would compromise the integrity of the metal layers. The solution according to one embodiment of the present invention may include using a combination of field oxide and BPSG/PSG from the CMOS process to realize the thermal barrier layer under the heaters in the MEMS portion of the printhead.

The insulating thermal barrier below the resistor may address the heat flow mainly towards the ink, to provide an effective energy transfer to the liquid. Nevertheless, having moderate heat dissipation to the substrate may be preferable to control and stabilize the overall system temperature.

According to one embodiment of the present invention a suitable value for the thermal barrier thickness is in the range of 0.6 to 2.0 μm, preferably in the range 0.8 to 1.6 μm and most preferably in the range 1.0 to 1.2 μm.

Hence, the total thickness of the FOX and/or BPSG of the CMOS process may comply with this thickness value. Since the thickness of these layers may change with the process and with the technology node, it may be necessary to select these elements carefully in order to have the right thermal barrier thickness.

Figure 9:
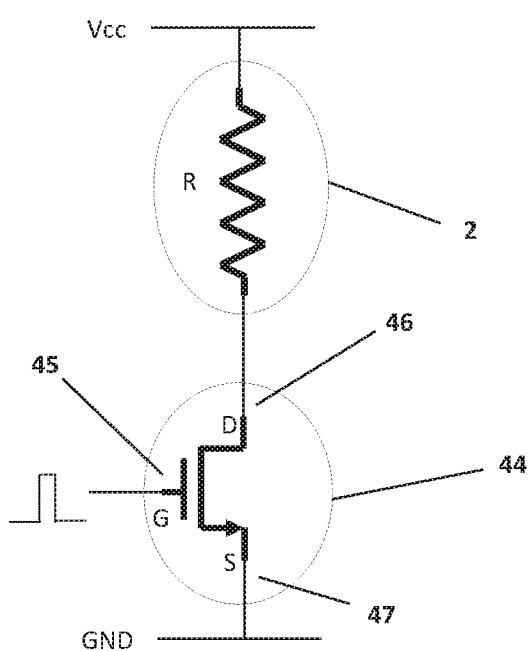
FIG. 9 shows a schematic circuit of a heater element driven by a NMOS transistor according to one embodiment of the present invention.

The schematic circuit of a power MOS driving a printhead heater is shown in FIG. 9. The power MOS 44 may be an re-channel or p-channel metal-oxide-semiconductor field-effect transistor (MOSFET) and may act as a current switch, depending on voltage level of a signal sent to a gate 45. The resistor R corresponding to a heater 2 is connected to a MOS drain terminal 46 while a MOS source terminal 47 is connected to ground. The other terminal of the heater 2 may be in electrical communication with a power rail.

If the gate signal is at a low voltage level, a NMOS switch may be open, i.e. the transistor may not conduct and no current may flow through the heater 2. A high voltage level applied to the gate 45 may bring the NMOS in conduction and the heat dissipated in the resistor due to current flow may cause ink bubble growth and the further ejection of a drop from a printhead nozzle.

Since source and drain contacts of the transistors made in a CMOS foundry may be realized with a first metallization layer (M1), the first metallization layer 37 may have to be protracted so that it reaches the MEMS region boundary. This may allow M1 conductive tracks coming from the transistors to be subsequently brought in electrical communication with the heater circuitry, within the MEMS foundry processes.

Figure 10:
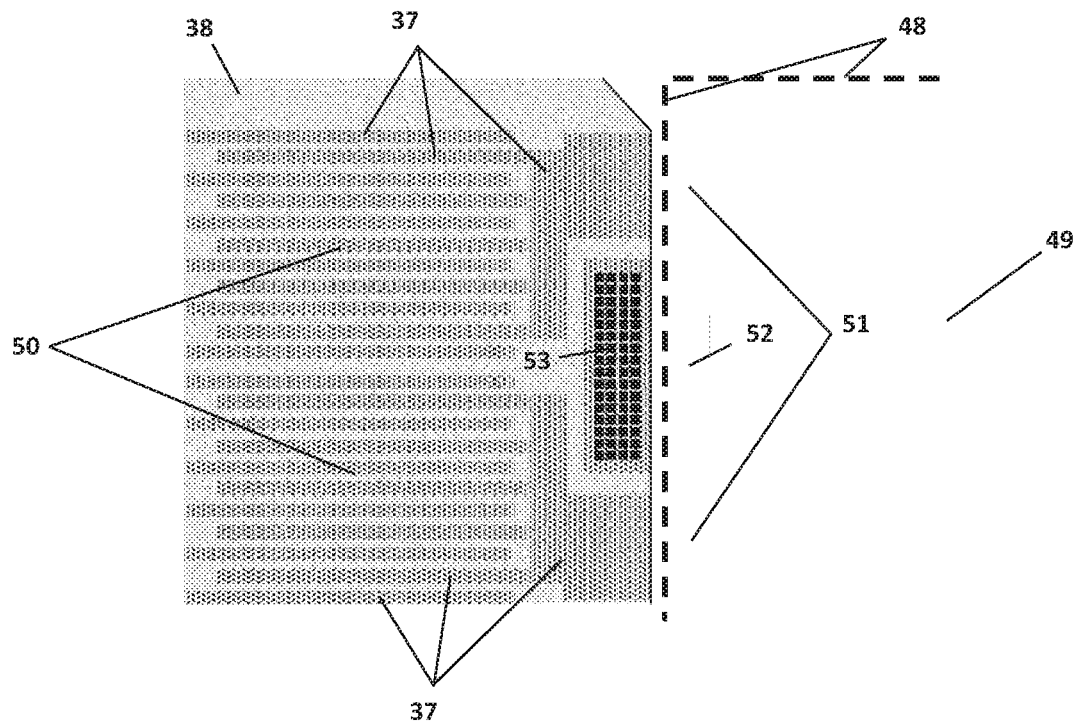
FIG. 10 shows a top view of a boundary zone between a CMOS circuit and a MEMS region according to one embodiment of the present invention.

A portion of the connection boundary between the CMOS device and the MEMS circuitry is shown in FIG. 10, including a pair of power MOS transistors 50. The first operation of the MEMS foundry may be the opening of a MEMS window 48, etching IMD and passivation layers above a MEMS region 49, down to a BPSG surface and uncovering also one end of short metal tracks 51 prolonged from the M1 metallization 37 laying onto the BPSG layer, which may be necessary for further contacting one terminal of the heaters with the MOS transistors. Another M1 metal track 52 made in M1 may have to be uncovered at one end for contacting the other terminal of the heaters to a power bus. The power bus may be realized in a M2 layer 38 and suitable vias 53 may be realized in the Inter Metal Dielectric IMD1 to provide the contact with the underlying M1 track 52.

The planarity requirements during the CMOS process and the necessary protection of the device during the silicon chip or wafer transfer between the two foundries may entail the preservation of the Inter Metal Dielectrics as well as all the top passivation. Therefore, also the MEMS region may turn out to be covered by these layers when the semi-finished or pre-fabricated device is received at a MEMS foundry to complete the printhead manufacturing process.

According to one embodiment of the present invention a stack of layers formed over the first metal layer may have a thickness of less than 3.5 µm and preferably a thickness between 2 and 3 µm.

The MEMS region may lie at a substantial lower level than the top of the neighboring CMOS device area, the latter comprising all the metallization as well as the dielectric layers. Therefore, in the transition between the two zones an appreciable step arises. Since the PVD process used for the deposition of the metal layers of the MEMS circuitry suffers of a step shadowing effect, the connection of the latter with the M1 metallization of the CMOS device may be few microns away from the step wall.

According to one embodiment of the present invention the first metal layer is formed across all of the section for forming the thermal actuator element, i.e. heater section.

According to one embodiment of the present invention the method may further comprise a step of partly removing the first metal layer in the section for forming the thermal actuator element, i.e. the heater section. This may also be referred to as etch stop removal process step.

According to one embodiment of the present invention the method may further comprise a step of forming a dielectric layer over the section for forming the thermal actuator element, i.e. the heater section, and the integrated electronic circuit covering at least the metal track layer and the resistive layer in the section for forming the thermal actuator element, i.e. heater section.

According to one embodiment of the present invention the method may further comprise comprising the step of forming a cavitation layer over the dielectric layer in the first region. This may also be referred to as resistor opening process step.

Also the lithography in the proximity of the sidewall may need to meet further constraints. A sloped sidewall may help the lithography of the MEMS circuitry and can be accomplished modulating the resist thickness to perform a tapered etching, according the state of the art, provided that the step height is not excessively large. The current situation prevents the straightforward integration between the two technologies, because the standard CMOS device described above may have a number of layers too high to result in an acceptable step height.

To overcome this issue, according to one aspect of the present invention a process flow to reduce as much as possible the step height may be introduced, remaining anyhow within the limits of a standard process. Therefore, the topmost metal layer M3 may be eliminated. The M3 layer may be subsequently replaced by an adequate metallization, during the MEMS process phase, as will be shown in the following.

On the contrary, the M2 metallization may be necessary to complete the interconnections in the logical circuit and it may be maintained. The logic interconnection pattern likely may require high resolution processes and may not be carried out in the MEMS foundry without any issue.

According to one embodiment of the present invention the thermal actuator element and the integrated electronic circuit may form parts of a thermal inkjet printhead.

According to another embodiment of the present invention the thermal actuator element is a fluidic thermal actuator.

Moreover, if the semi-finished, i.e. pre-fabricated, printhead chip, as delivered by the CMOS foundry, is provided with the second metallization level M2, it can anyhow be fully tested with respect to the logical circuitry, before the MEMS processes take place. This solution may establish a net boundary between the CMOS and the MEMS portion of the device and may facilitate localization of possible failure sources. On the contrary, an alternative solution where the sole M1 layer is realized by the CMOS foundry would provide an even lower step height, but it would criticize the back tracking in case of functional faults. Therefore, the solution comprising both M1 and M2 is preferred.

The IMD2 layer may be left above M2, to guarantee the insulation and the planarization of the surface for the further processes, but its thickness may be reduced as much as possible. Also the IMD1 dielectric layer, below M2, can be reduced in thickness, to a level able to guarantee the sufficient insulation and planarization.

In order to lower the step height further, a moderate reduction of the metal layers thickness could be done, if it meets technology constraints. Finally, one of the two passivation layers may be eliminated and the thickness of the remaining passivation layer may be reduced to a minimum value, able to guarantee a sufficient protection of the device.

Figure 11:
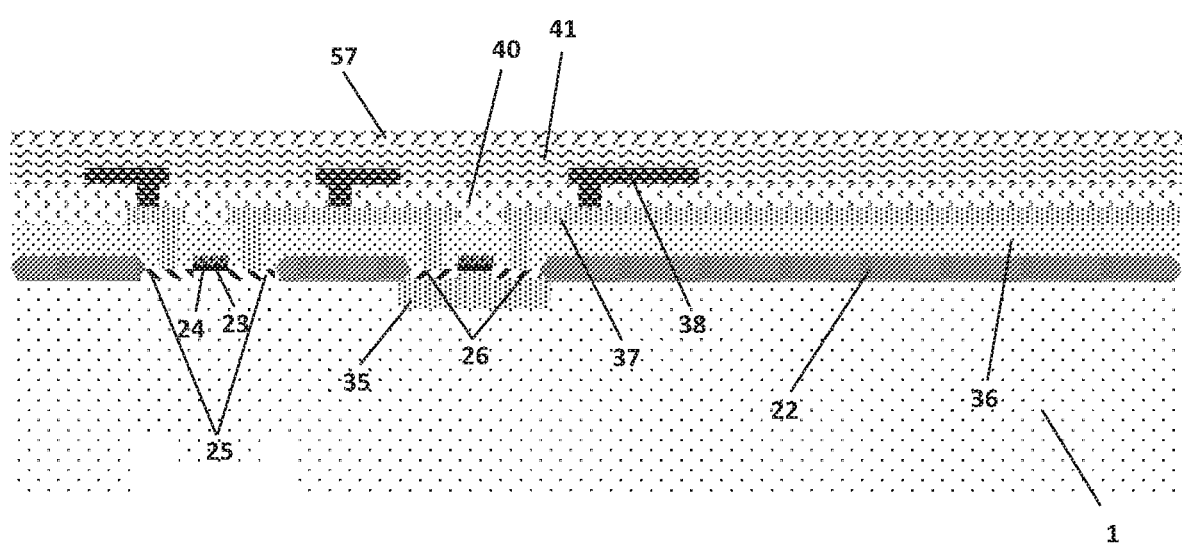
FIG. 11 shows a cross-sectional view of a CMOS structure according to one embodiment of the present invention.

The cross section of this custom or simplified CMOS structure, according to the invention, is depicted in FIG. 11. As a single passivation layer 57, a silicon nitride layer may be preferable, due to the good electrical insulation and protection against moisture it can provide.

According to one embodiment of the present invention the thickness of the stack comprised of the cavitation layer and the metal track layer may be thinner than the first metal layer of the integrated electronic circuit.

In conclusion, the above embodiment of the present invention may produce a simplified CMOS structure, having only two metal layers M1 and M2, two thin Inter Metal Dielectric layers and a single thin passivation layer, where the thickness of all mentioned layers has been reduced to a minimum value compatible with standard process limits and device integrity. This solution allows obtaining a moderate step height, preferably below 3.5 µm, and more preferably between 2 and 3 µm, suitable for a tapered etching process, in order to remove any additional layer from the MEMS area, leaving only the thermal insulating layer made of BPSG and field oxide having a predetermined thickness, as required by printhead specifications.

According to another embodiment of the present invention an appreciable etching selectivity between the IMD and passivation layers and the BPSG may be provided. Due to the not-uniformity of the IMD layers and the not-uniformity of the etching processes, the BPSG may have to undergo an over-etching to guarantee the total removal of the thermally unstable IMD layers. Therefore, the accuracy of the thermal barrier thickness cannot be controlled as it would be necessary to have stable and correct performances of the heaters. This may limit integration of the CMOS circuitry with the MEMS part.

Figure 12:
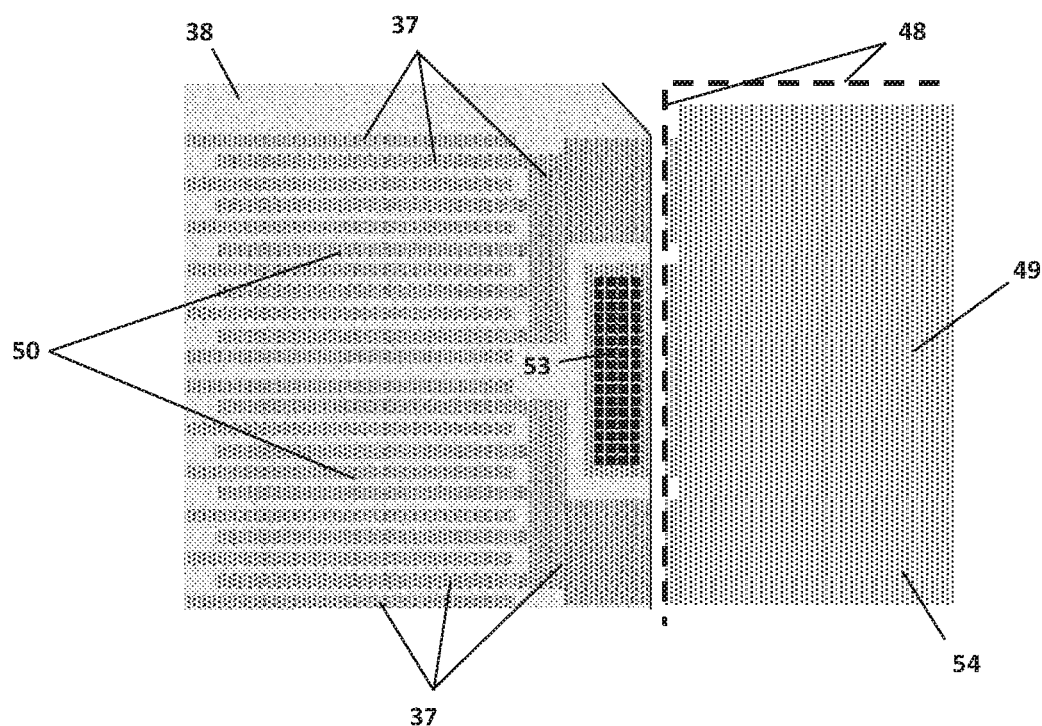
FIG. 12 shows a top view of the boundary zone between the CMOS circuit and the MEMS region after etching according to one embodiment of the present invention.

As illustrated in FIG. 12 one embodiment of the present invention may include an extension 54 of the first CMOS metallization layer M1 beyond the normal boundary of the logic circuitry and the prolonged tracks 51 and 52 as described above with respect to FIG. 9, in order to cover nearly all the BPSG surface in the MEMS region. Due to its high resistance to the etching process of the IMD and passivation layers, the M1 layer extension may act as a real etch-stop layer, maintaining the BPSG film thickness unaffected, while the ILD and the passivation layers may be completely removed in the internal part of the MEMS window 49, marked by the boundary outline 48.

Figure 13:
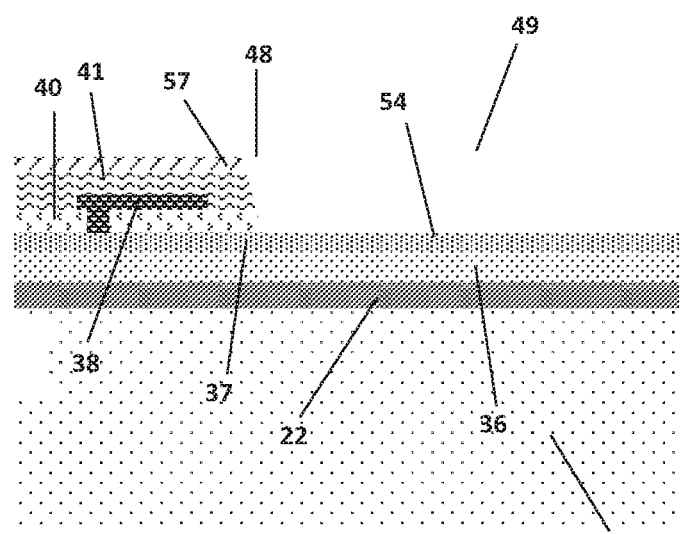
FIG. 13 shows a cross-sectional view of the boundary zone between the CMOS circuit and the MEMS region after etching according to one embodiment of the present invention.

FIG. 13 shows a corresponding cross-section of the structure, after MEMS window opening, i.e. etching of the passivation and the two IMD layers in region 49, delimited by the outline 48.

Figure 14:
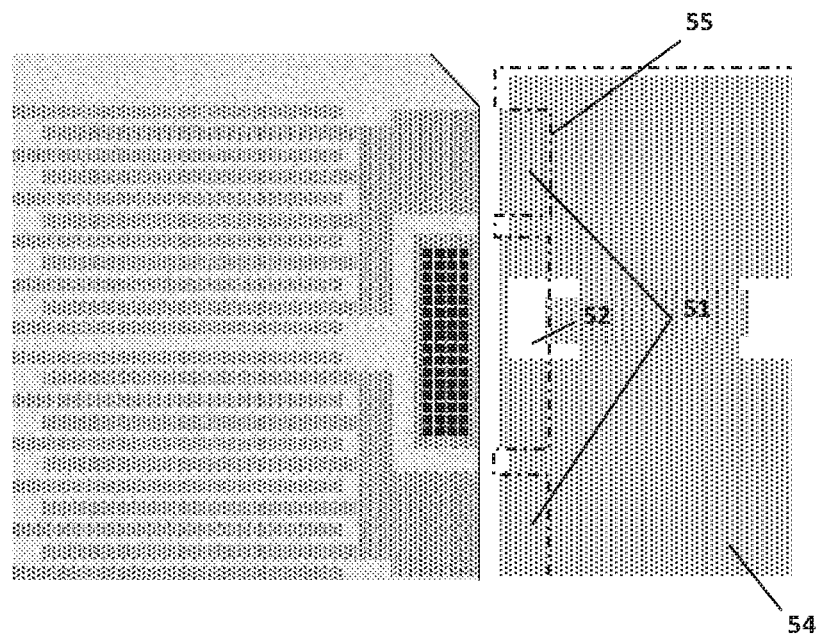
FIG. 14 shows a pattern outline of a metallization etching mask according to one embodiment of the present invention.

The metal layers of the CMOS device layer may not be adequate to be used in the MEMS circuit for realizing the conductive and resistive tracks for the flow of the heater current. Therefore, the extension of M1 may have to be subsequently removed, except for the contact regions at the end of the tracks 51 and 52, leaving the rest of the surface inside the MEMS window 48 devoid of the metal layer and ready for subsequently depositing and patterning the suitable MEMS films. Removal of the M1 extension 54 may be carried out in conformity with a suitable pattern outline 55, to maintain the M1 protractions at the MEMS region boundary so that the contacts with them can be realized, as depicted in FIG. 14.

Figure 15:
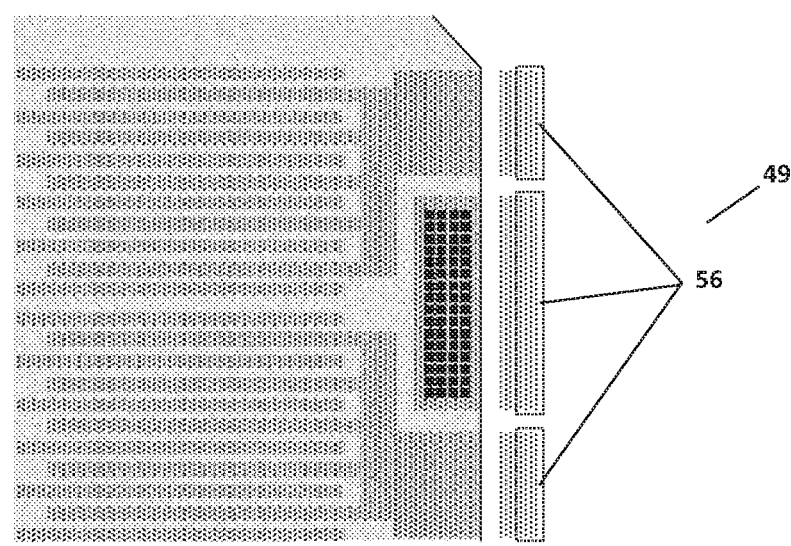
FIG. 15 shows a top view of a circuit layout after removal of a M1 metal layer according to one embodiment of the present invention.
Figure 16:
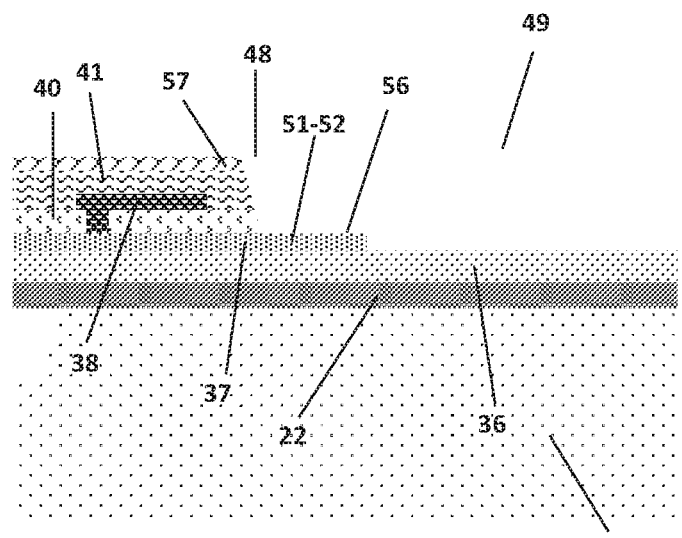
FIG. 16 shows a cross-sectional view of a circuit layout after removal of the M1 metal layer according to one embodiment of the present invention.

After removing the M1 extension 54 through a suitable etching process, the resulting layout is shown in FIG. 15 and in the corresponding cross-section of FIG. 16. The MEMS region 49 may be devoid of any metal layer from the CMOS device, except for the tracks 51 and 52 with the terminal contact regions 56. The MEMS region 49 may have a BPSG film as a topmost layer, thickness of which may have been unaffected by the subsequent etching processes, providing a stable and controlled thermal insulating layer for the heaters. At the very end of the left M1 protrusions 51 and 52, in the regions 56, the contacts with the MEMS circuit may have to be realized, as will be shown in the following.

Figure 17:
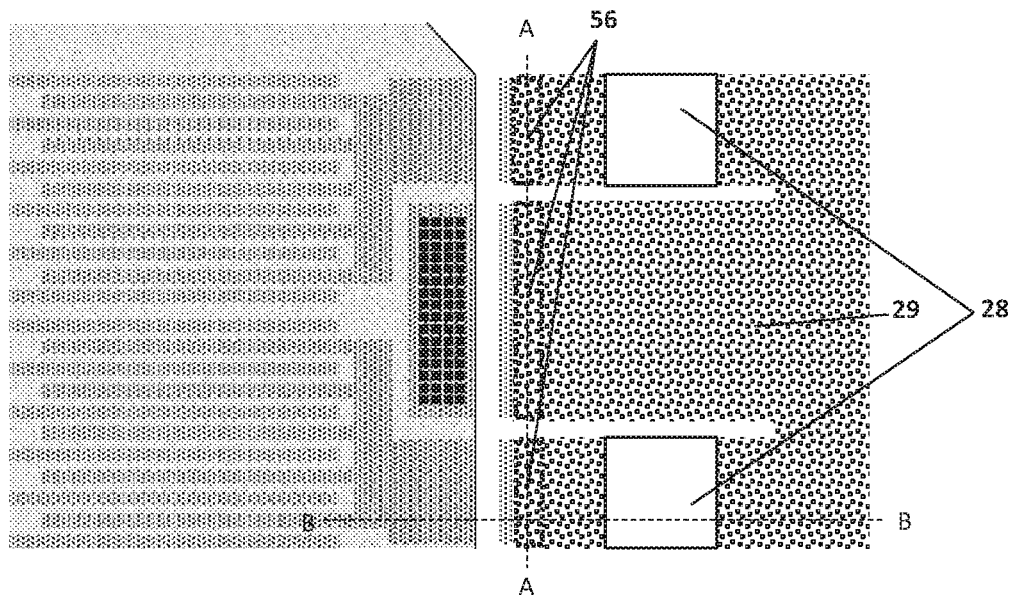
FIG. 17 shows a top view of integration between a thermal actuator element and the CMOS circuit.

As shown in FIG. 17, the MEMS circuitry in the MEMS region may be obtained depositing and patterning the Ta—Al resistive composite layer 28 and the aluminum layer 29, according to the process described above. As mentioned above, the aluminum layer 29 can contain small percentage of Cu or Si or both. The aluminum layer 29 may overlap the protrusions of the CMOS device M1 in the contact regions 56. In the figure, the represented circuit layout shows two different heaters, which may be connected to their own respective power MOS at one side and at a common power bus at the other side. However, also other suitable layout configurations may be possible.

Figure 18:
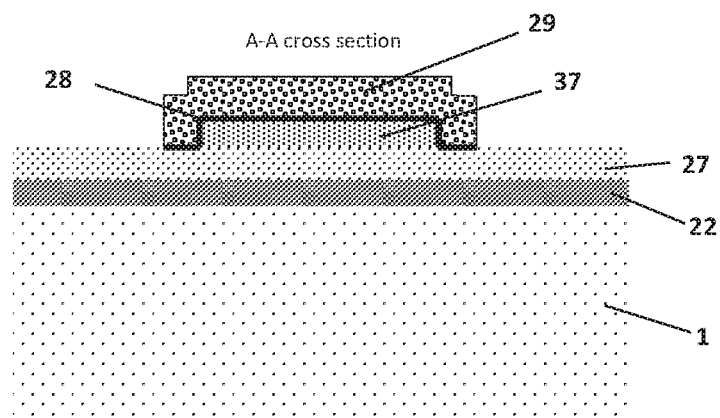
FIG. 18 shows a cross-sectional view a long a line of A-A in FIG. 17 of the contact region between thermal actuator element and the CMOS metallization.

According to another embodiment of the present invention, in order to guarantee the correct contact area between the CMOS and the MEMS metallization, preventing possible issues due to the poor alignment accuracy of the MEMS circuitry, the MEMS tracks may be wider than the corresponding M1 tracks, as illustrated in FIG. 18.

The cross sectional view in FIG. 18 is taken along the A-A line of the top view in FIG. 17 and shows the film stack in the MEMS boundary zone, after the patterning of both a resistive Ta—Al layer 28 and a conductive Al layer 29. The silicon substrate 1 may be covered by a FOX layer 22 and a BPSG layer 27. The two layers may form the thermal insulating layer onto which the heaters are made.

At the MEMS boundary region the first CMOS metal layer 37 may be covered and contacted by a MEMS metallization layer, which comprises both the Ta—Al layer 28 and the aluminum layer 29. The MEMS metallization pattern may be made wider than the CMOS track M1 and the latter may turn out to be wrapped up by the MEMS metallization.

However, in another embodiment of the present invention the MEMS metallization layer, which may comprise both the Ta—Al layer 28 and the aluminum layer 29, can be made narrower than the first CMOS metal layer 37.

Figure 19:
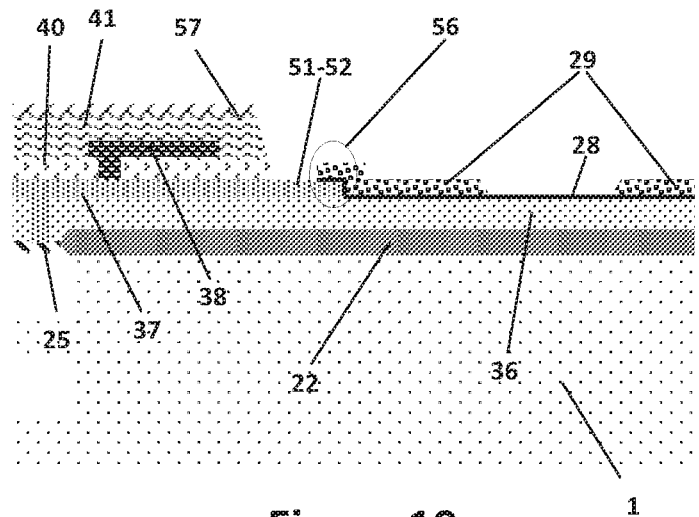
FIG. 19 shows a cross-sectional view along the line of B-B in FIG. 17 along the thermal actuator element and a MOS drain contact.

An orthogonal cross sectional view is shown in FIG. 19. It is taken along the orthogonal B-B line of the top view in FIG. 17. The heater structure, the step between CMOS and MEMS regions and the M1 contact with the MOS drain diffusion are illustrated.

As described above with respect to FIG. 9 the power bus may be realized in the M2 layer 38 and suitable vias 53 may be realized in the Inter Metal Dielectric IMD1 to provide the contact with the underlying M1 track 52. However, M2 may not carry the high current level necessary for a printhead, along the pathway to the peripheral contact pads. On the other hand, in the NMOS printhead, the topmost metallization may include a double layer Ta+Au which may be used for the power and ground rails, as it may be able to carry high current levels.

Figure 6:
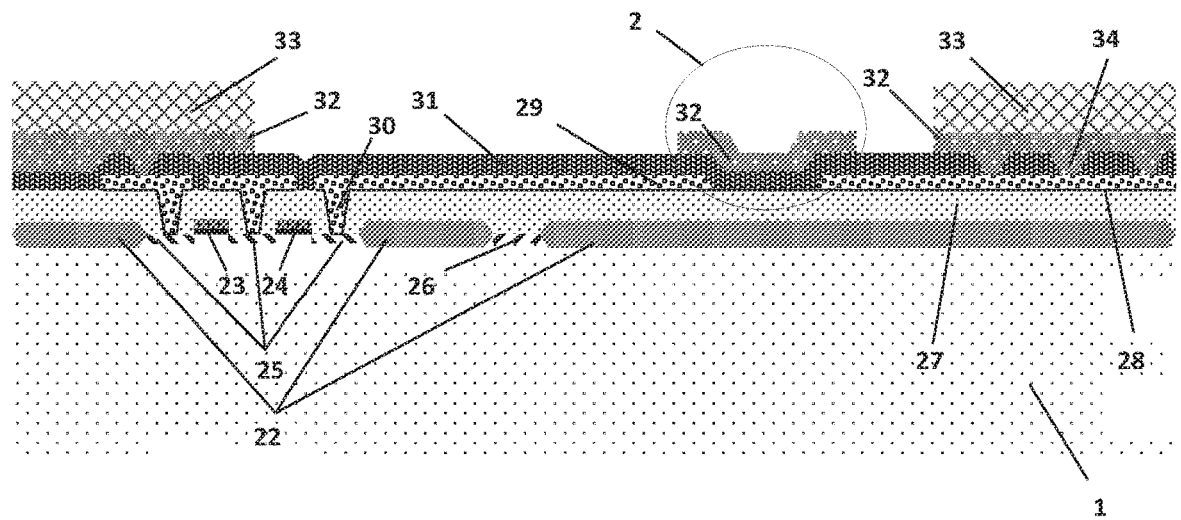
FIG. 6 shows a cross-sectional view of a NMOS printhead.
Figure 7:
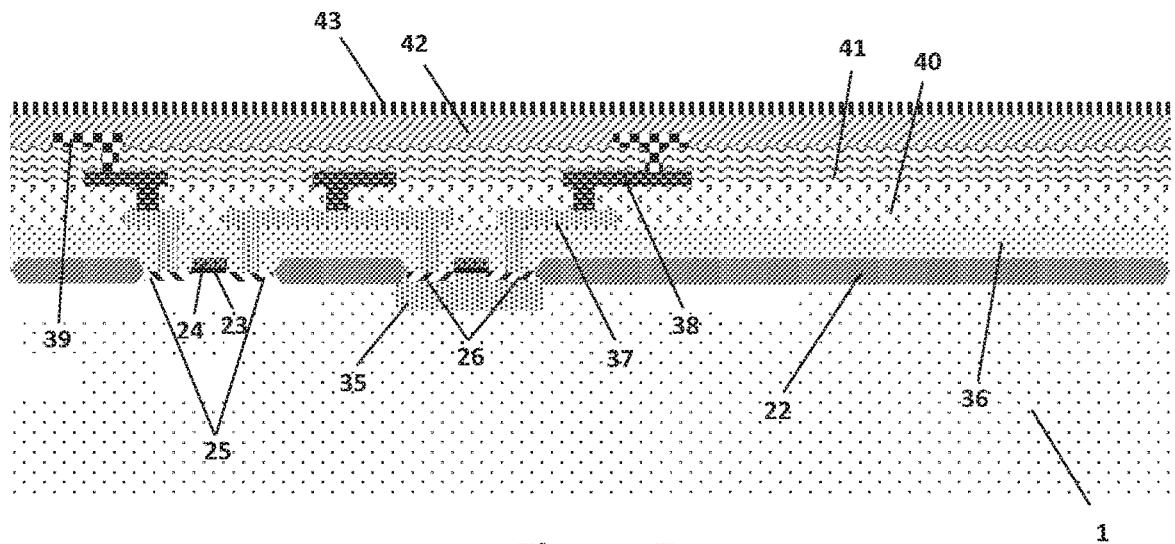
FIG. 7 shows a cross-sectional view of a standard CMOS circuit.

According to yet another embodiment of the present invention a double Ta+Au film as a topmost layer for power and ground rails which require a low resistance path may be used. The heaters in the MEMS region 49 may need to be covered by an insulating and protective film stack, as described above with respect to FIG. 6. A dielectric film 31 composed by a first silicon nitride layer and a second silicon carbide layer is deposited above the heater metallization.

Figure 20:
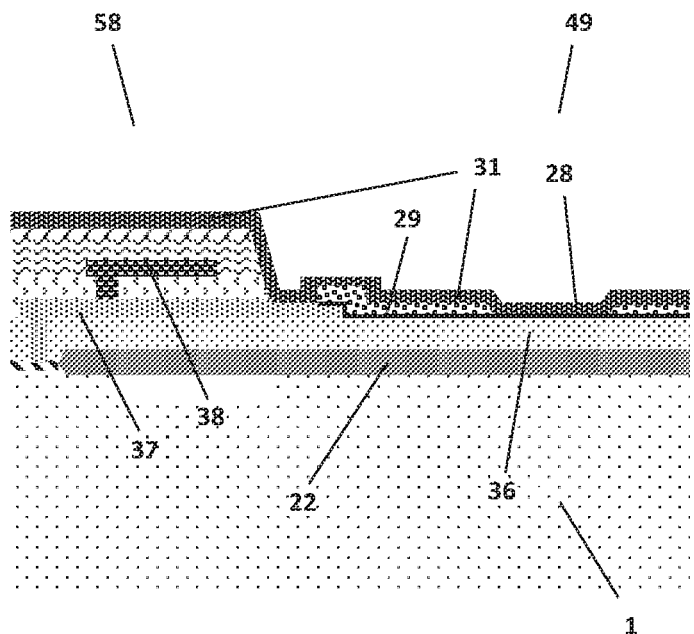
FIG. 20 shows a cross-sectional view along the line of B-B in FIG. 17 after depositing a silicon nitride and a silicon carbide dielectric film.

The deposition of the dielectric film 31 can be extended also in the CMOS device region 58, as shown in FIG. 20, providing an improved dielectric insulation for the overlying topmost Ta+Au metallization. The silicon nitride which forms a CMOS single passivation layer 57 may have a good compatibility with the silicon nitride layer in the dielectric film 31, allowing a good adhesion at the interface between the two layers. Moreover, the silicon carbide may enhance the robustness on the whole chip surface.

Figure 21:
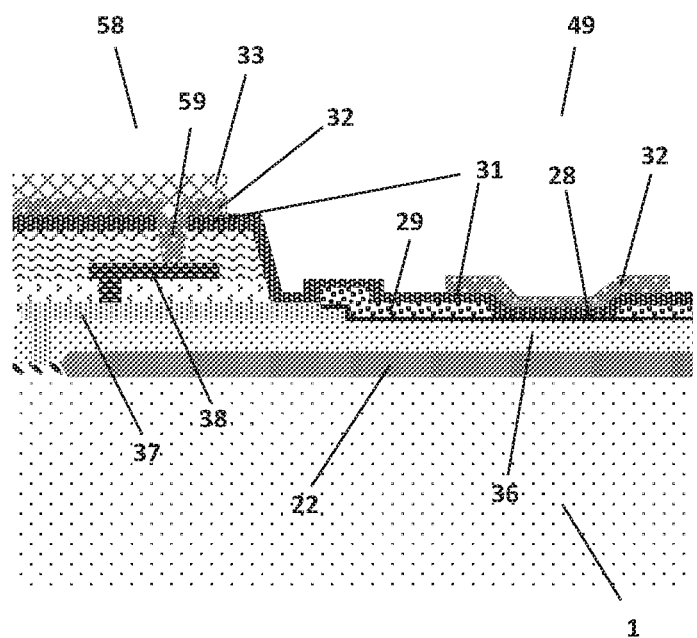
FIG. 21 shows a cross-sectional view along the line of B-B in FIG. 17 after depositing topmost tantalum and gold layers.

Suitable vias may be etched through the whole dielectric stack composed by IDM2, passivation, silicon nitride and silicon carbide, to realize a contact 59 between topmost Ta+Au metallization and the underlying M2 metal layer, belonging to the CMOS circuitry, as illustrated in FIG. 21.

This final metallization, deposited and patterned onto the whole dielectric film stack, may include a first Ta layer 32, which may be used both as a cavitation layer onto the heater in the MEMS region 49 and as a buffer adhesion enhancing layer in the CMOS region 58, where the topmost metallization layer may be completed by a second Au layer 33, adhesion of which with the underlying Ta film is good.

Before the topmost metal deposition takes place, some of the mentioned films may be removed to achieve a thinner dielectric stack, according to another embodiment of the present invention. Finally, the double Ta+Au film may provide suitable conductive tracks on the top of the CMOS device region, fully adequate to carry the high current flowing in the power and bus rail of a printhead.

The described processes allow producing a printhead silicon chip, integrating a CMOS standard semi-finished device manufactured by a first silicon foundry with a MEMS actuator produced in a second silicon foundry. The integration allows obtaining a cost effective printhead device, where the full testability of the CMOS circuitry right after receiving the semi-finished device is assured.

According to another embodiment of the present invention it is provided a thermal inkjet printhead including an integrated electronic circuit and a section for forming a thermal actuator element, formed according to a method according to one embodiment of the present invention.

According to one embodiment of the present invention integrating a high resolution CMOS circuitry produced in an external foundry with fluidic MEMS actuator, where special materials are adopted, is possible. The selected CMOS process may enable testing extensively the CMOS logical device, not needing high power level, guaranteeing at the same time a moderate step height in the transition boundary between the CMOS region and the MEMS region, which may facilitate carrying out the photolithographic processes involved in the printhead fabrication.

According to another embodiment of the present invention the controlled thickness of a thermal insulating layer below a heater may be assured by a suitable extension of a first CMOS metal layer throughout the whole MEMS area and conductive tracks for the high current level in both the power and ground rails provided by the topmost metallization deposited and patterned in the MEMS foundry.

The present invention provides a high performance and cost effective device, produced without involving heavy investments in technological equipment.

Although detailed embodiments have been described herein, these only serve to provide a better understanding of the invention defined by the independent claims, and are not to be seen as limiting the present invention.

In particular, the above description of the invention indicates specific materials to be used, however, unless specified otherwise, these are only to be seen as specific examples and may be replaced with other suitable material within the scope of the present invention defined by the claims.

REFERENCE SIGNS 1 substrate
2 heater
3 heater array
4 feedthrough-slot
5 wafer
6 contact pad
7 flexible circuit
8 cartridge body
9 contact pad
10 active part
11 power transistor
12 logic circuit
13 programmable memory
14 printhead film structure
15 ink feeding channel
16 ejection chamber
17 barrier layer
18 nozzle plate
19 nozzle
20 ink droplet
21 ink vapor bubble
22 thermally grown field oxide (FOX)
23 gate oxide
24 polysilicon gate
25 n+ doped region
26 p+ doped region
27 boron phosphorus silicon glass (BPSG)
28 Ta—Al resistive layer
29 Aluminum metal track
30 contact
31 dielectric layer
32 Tantalum cavitation layer
33 Au conductive layer
34 contact
35 n-well
36 inter-layer dielectric (ILD)
37 first metallization level (M1)
38 second metallization level (M2)
39 third metallization level (M3)
40 first inter-metal dielectric layer (IMD1)
41 second inter-metal dielectric layer (IMD2)
42 first top passivation layer (PAST)
43 second top passivation layer (PAS2)
44 power NMOS transistor
45 NMOS gate terminal
46 NMOS drain terminal
47 NMOS source terminal
48 MEMS window outline
49 MEMS region
50 power MOS transistors
51 prolonged MOS drain metallization layer
52 prolonged Vcc metallization
53 vias
54 extension of the first CMOS metallization level M1
55 etching mask outline
56 contact region
57 passivation layer
58 CMOS circuitry area
59 contact

The invention claimed is:

1. A method for forming a thermal inkjet printhead, comprising at least the following steps: providing a semiconductor wafer including an integrated electronic circuit and a section for forming a thermal actuator element, the integrated circuit comprising at least:
   a thermal insulating layer formed over a substrate; and
   a first metal layer formed over the thermal insulating layer;
   wherein the first metal layer extends into the section for forming the thermal actuator element; and
   etching a portion of the section for forming a thermal actuator element to the first metal layer such that the first metal layer is acting as an etch stop layer,
   wherein the integrated electronic circuit is produced in a complementary metal oxide semiconductor (CMOS) foundry and the section for forming the thermal actuator element is produced in a micro-electromechanical system (MEMS) foundry.

2. The method according to claim 1 further comprising a step of partly removing the first metal layer in the section for forming the thermal actuator element.

3. The method according to claim 1 further comprising a step of forming a resistive layer at least partly over the thermal insulating layer in the section for forming the thermal actuator element and at least partly over the first metal layer together with a metal track layer at least partly over a resistive layer and removing the metal track layer in a first region using photolithography and etching technology.

4. The method according to claim 1, further comprising a step of forming a dielectric layer over the section for forming the thermal actuator element and the integrated electronic circuit covering at least a metal track layer and a resistive layer in the section for forming the thermal actuator element.

5. The method according to claim 1, further comprising a step of forming a cavitation layer over the dielectric layer in the first region.

\* \* \* \* \*